United States Patent
Chang

(10) Patent No.: US 8,516,693 B2
(45) Date of Patent: Aug. 27, 2013

(54) PRINTED CIRCUIT BOARD WITH EMBEDDED ELECTRONIC COMPONENTS AND METHODS FOR THE SAME

(75) Inventor: Jung-Chien Chang, Xinzhuang (TW)

(73) Assignee: Mutual-Tek Industries Co., Ltd., Xinzhuang, Taipei County, Taiwan (CN)

(*) Notice: Subject to any disclaimer, the term of this patent is extended or adjusted under 35 U.S.C. 154(b) by 1175 days.

(21) Appl. No.: 12/421,142

(22) Filed: Apr. 9, 2009

(65) Prior Publication Data

US 2009/0266596 A1    Oct. 29, 2009

(30) Foreign Application Priority Data

Apr. 23, 2008    (TW) .............................. 97114790 A

(51) Int. Cl.
*H05K 3/30*    (2006.01)

(52) U.S. Cl.
USPC ................ 29/841; 29/832; 29/846; 438/478; 438/482; 438/328; 439/620.09

(58) Field of Classification Search
USPC ............. 29/832, 841, 825, 829, 846; 439/55, 439/620.09, 620.13; 257/787; 438/478, 438/481, 41, 341, 388, 328, 25, 26, 105, 438/125–127
See application file for complete search history.

(56) References Cited

U.S. PATENT DOCUMENTS

2002/0133943 A1* 9/2002 Sakamoto et al. ............... 29/846
2004/0221451 A1* 11/2004 Chia et al. ........................ 29/854

* cited by examiner

*Primary Examiner* — Peter DungBa Vo
*Assistant Examiner* — Jeffrey T Carley
(74) *Attorney, Agent, or Firm* — Snell & Wilmer L.L.P.

(57) ABSTRACT

The present invention discloses a printed circuit board. The printed circuit board is made by the method of providing a substrate; forming a first circuit on the substrate; depositing a thin film on the substrate; building an electronic component on the substrate by the thin film and allowing the electronic component to electrically connect the first circuit; forming a blanket dielectric layer enclosing the electronic component; and removing the substrate.

9 Claims, 7 Drawing Sheets

US 8,516,693 B2

PRINTED CIRCUIT BOARD WITH EMBEDDED ELECTRONIC COMPONENTS AND METHODS FOR THE SAME

CROSS REFERENCE TO RELATED APPLICATIONS

This application claims the right of priority based on Taiwan Patent Application No. 97114790 entitled "Printed circuit board with embedded electronic components and methods for the same" filed on Apr. 23, 2008, which is incorporated herein by reference and assigned to the assignee herein.

FIELD OF THE INVENTION

This invention relates to a printed circuit board, and more particularly relates to a printed circuit board with embedded electronic components and methods for the same.

BACKGROUND OF THE INVENTION

A printed circuit board is a device on which a circuit pattern is constructed for providing connection between various electronic components. FIG. 1 is a cross-sectional view illustrating a conventional printed circuit board 10 with electronic components, such as integrated circuit 20 and passive component 30, connected thereto. As shown, the conventional printed circuit board 10 and the integrated circuit 20 are connected to each other through a surface mount technology. Typically, the integrated circuit 20 is a packaged electronic component having leads 21, being connected to lines 11 of the printed circuit board 10 via the leads 21 using a bonding technology.

The customers have been continuously seeking more and more compact electronic products, but the conventional printed circuit board 10 is behind the trend. That is, the conventional printed circuit board 10 suffers from obstacle in shrinking device size. For example, the printed circuit board 10 must provide sufficient area for the electronic components mounted thereon, thus, adversely affecting the shrinkage of device size. In addition, the integrated circuit 20 mounted on the printed circuit board 10 has usually been packaged, such that it is much larger than the bare chip and also adversely affecting the shrinkage of device size.

Accordingly, an improved structure and method capable of solving the above-mentioned problems are desirable.

SUMMARY OF THE INVENTION

The invention provides a printed circuit board with embedded electronic components. A circuit is formed on a temporary substrate using a printed circuit board fabrication process, and then electronic components, such as diodes, transistors, and other optical semiconductors, are directly built on the temporary substrate to electrically connect to the circuit. Thereafter, the circuit and the electronic components are simultaneously enclosed employing suitable materials prior to removal of the temporary substrate.

The invention at least has the following features capable of facilitating shrinkage in dimension for a final electronic product. The features includes that the electronic components are embedded in an insulation layer; the electronic components are directly built on the substrate, and the circuit and the electronic components are then enclosed simultaneously after completion of the electronic components; the temporary substrate is removed after that the circuit and the electronic components are printed on the enclosing insulation layer. The features result in reduction of the thickness for a final electronic product.

One aspect of the present invention is to provide a method of forming a printed circuit board. The method comprises the steps of: providing a substrate; forming a first circuit on the substrate; depositing a thin film on the substrate; building an electronic component on the substrate by the thin film and allowing the electronic component to electrically connect the first circuit; forming a blanket dielectric layer enclosing the electronic component; removing a portion of the dielectric layer to expose an upper surface of the electronic component; forming a second circuit on the dielectric layer, the second circuit being electrically connected to the electronic component; forming an insulating layer covering the second circuit and the dielectric layer; and removing the substrate.

Another aspect of the present invention is to provide a method of forming a printed circuit board. The method comprises the steps of: providing a substrate; forming a first circuit on the substrate; building an electronic component electrically connected to the first circuit on the substrate; forming a blanket dielectric layer enclosing the electronic component; removing a portion of the dielectric layer to expose an upper surface of the electronic component; forming a second circuit on the dielectric layer, the second circuit being electrically connected to the electronic component; forming an insulating layer covering the second circuit and the dielectric layer; and removing the substrate.

The objects and the features of the present invention may best be understood by reference to the detailed description with the accompanying drawings.

DETAILED DESCRIPTION OF THE INVENTION

Figure 1:
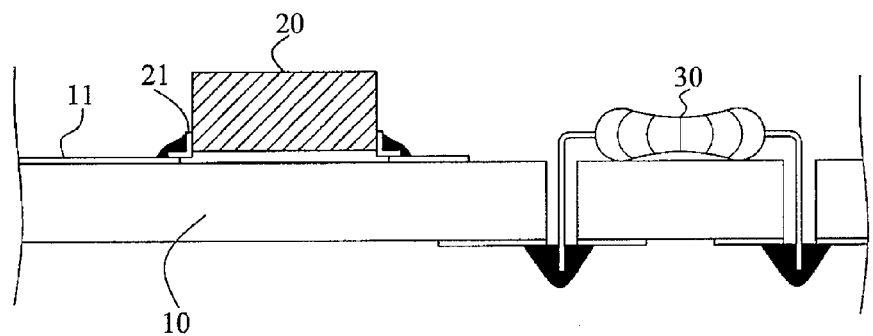
FIG. 1 is a cross-sectional view illustrating a conventional printed circuit board with electronic components connected thereto.
Figure 2A:
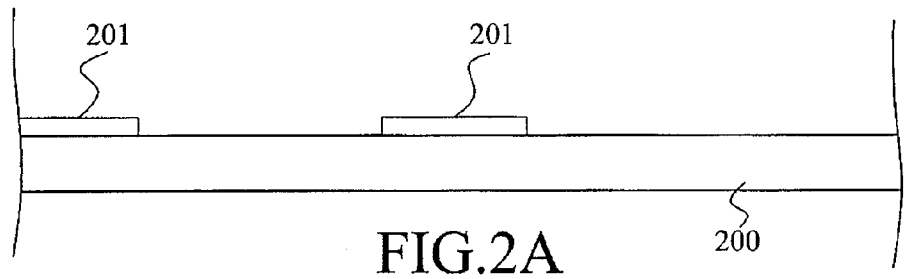
FIG. 2A to FIG. 2I are cross-sectional views illustrating a printed circuit board with embedded electronic components in accordance with a first embodiment of the present invention.

FIG. 2A to FIG. 2I are cross-sectional views illustrating a printed circuit board with embedded electronic components in accordance with a first embodiment of the present invention. Referring to FIG. 2A, a substrate 200 is provided for forming a first circuit 201 thereon. The substrate 200, preferably a conductive metal substrate, can be any suitable substrate, such as copper clad laminates or a thin stainless steel alloy plate. The first circuit 201 can be formed using a conventional printed circuit board fabrication process. For example, a dry film is formed over the substrate 200, and then patterned to expose a portion of the surface of the substrate 200. Thereafter, with the dry film serving as a mask, a material including Cu or Ni is electroplated on the exposed surface of the substrate 200. Subsequently, removal of the dry film leads to formation of the first circuit 201.

Figure 2B:
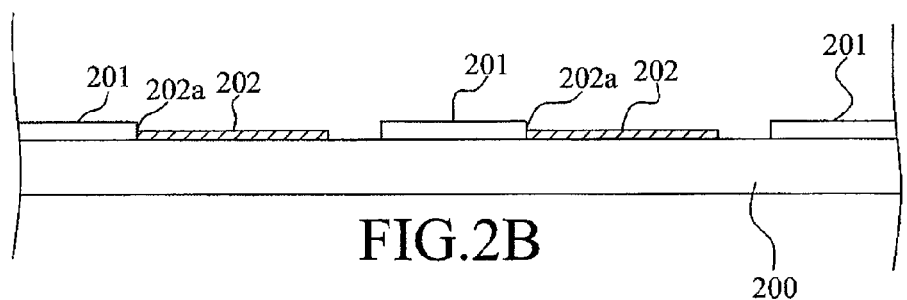

As shown in FIG. 2B, a thin film 202 is deposited on the substrate 200. For example, the thin film 202 having an end 202a connected to the first circuit 201 can be directly formed on the surface of the substrate 200. The thin film 202 serves a base for forming light emitting diodes (LEDs) thereon subsequently. In one embodiment, an LED epitaxial layer grows employing the thin film 202 made of GsAs, InP, GaP, sapphire, or SiC. The thin film 202 may be formed with patterned profile. Formation of the thin film 202 can utilize appropriate film deposition and masking techniques, such as conventional sputtering, chemical vapor deposition or screening printing.

Figure 2C:
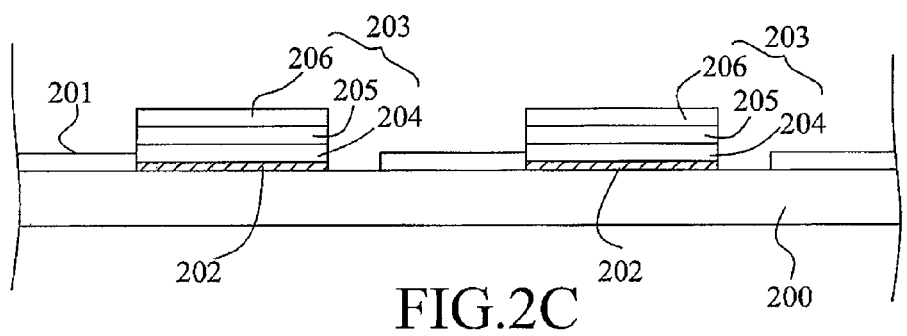

Referring to FIG. 2C, with the thin film 202 serving as a base, a light emitting structural layer 203 is formed on the substrate 200 using conventional epitaxy and semiconductor deposition techniques. The light emitting structural layer 203 includes several epitaxial layers, such as a first electronic semiconductor layer 204, a light emitting layer 205 and a second electronic semiconductor layer 206. For example, the first electronic semiconductor layer 204 can be a n-type epitaxial layer with the formula of $(Al_xGa_{l-x})_{0.5}In_{0.5}P$, and the light emitting layer 205 can be an undoped epitaxial layer with the formula of $(Al_xGa_{l-x})_{0.5}In_{0.5}P$, and the second electronic semiconductor layer 206 can be a p-type epitaxial layer with the formula of $(Al_xGa_{l-x})_{0.5}In_{0.5}P$. An electrical connection between the first electronic semiconductor layer 204 and the first circuit 201 is made through an appropriate relative thickness control for the thin film 202, the first electronic semiconductor layer 204 and the first circuit 201. Notably, both of the light emitting layer 205 and the second electronic semiconductor layer 206 should be isolated from the first circuit 201, or the light emitting structural layer 203 may not work. In other embodiments, the light emitting structural layer 203 also includes other functional layers, such as an ohmic contact layer, a barrier layer and a reflective layer.

Figure 2D:
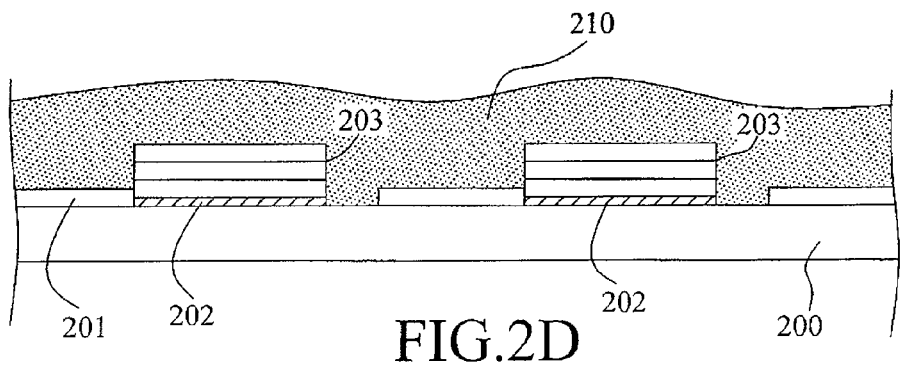

As shown in FIG. 2D, a dielectric layer 210 is blanketly formed, enclosing the light emitting structural layer 203 and the first circuit 201. The dielectric layer 210 can be spin on glass, silicon resin, epoxy, polyimide, or prefluorocyclobutane. Formation of the dielectric layer 210 can be conducted using a conventional precise coating process. It is noted that the light emitting structural layer 203 has not been packaged prior to formation of the dielectric layer 210.

Figure 2E:
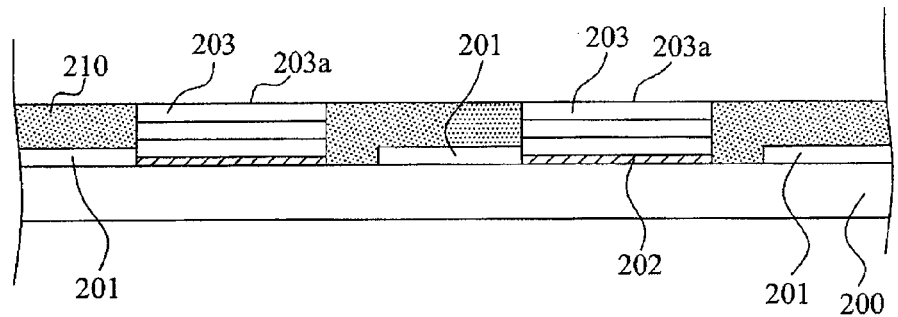
Figure 2F:
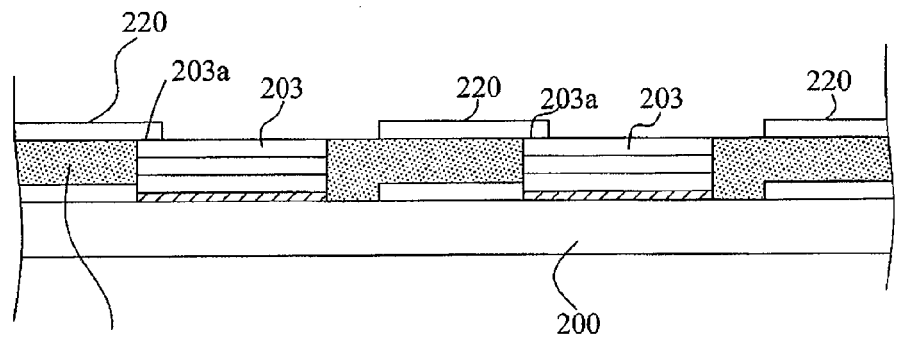

Referring to FIG. 2E, an appropriate chemical mechanical polishing technique is then employed to remove a portion of the dielectric layer 210, such that an upper surface 203a of the light emitting structural layer 203 is exposed. As shown in FIG. 2F, a second circuit 220 is formed on the dielectric layer 210, and electrically connected to the light emitting structural layer 203 through appropriate adjustment. For example, a patterned dry film is formed on the dielectric layer 210 and the upper surface 203a of the light emitting structural layer 203. Thereafter, a sputtering technique is performed to implant seeds of a conductive material with the patterned dry film serving as a mask. Subsequently, a second circuit 220 is formed on the dielectric layer 210 by conducting an electroplating process with the use of the seeds, and electrically connected to the upper surface 203a of the light emitting structural layer 203. In other embodiments, a conductive material, such as copper paste or silver paste, is printed on the dielectric layer 210 to form the second circuit 220 by a screening printing process.

Figure 2G:
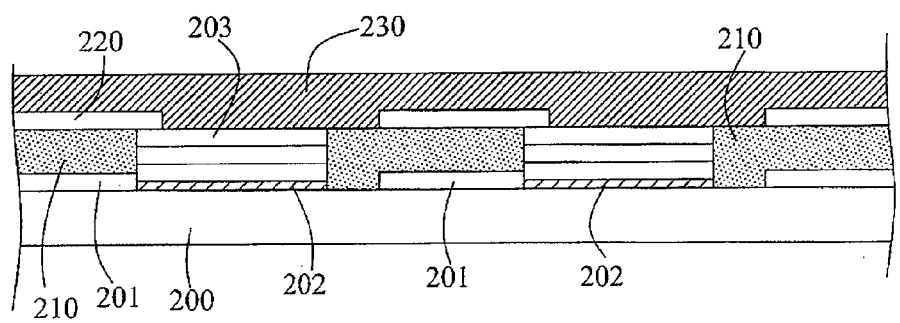

Then, referring to FIG. 2G, an insulating layer 230 is blanketly formed, and connected to the second circuit 220, the light emitting structural layer 203 and the dielectric layer 210. The insulating layer 230 can be polyester or polyimide, and it can further contain an appropriate reinforced material. The insulating layer 230 can be formed using a coating process. Alternatively, the insulating layer 230 can be a laminate of the above materials, which is then attached to the second circuit 220 and the light emitting structural layer 203. By way of appropriate adjustments, the insulating layer 230 can be thick and strong enough to serve as a support layer for the above elements, so that the substrate 200 can be removed using a conventional etching process. Accordingly, the structure shown in FIG. 2H is obtained.

Figure 2H:
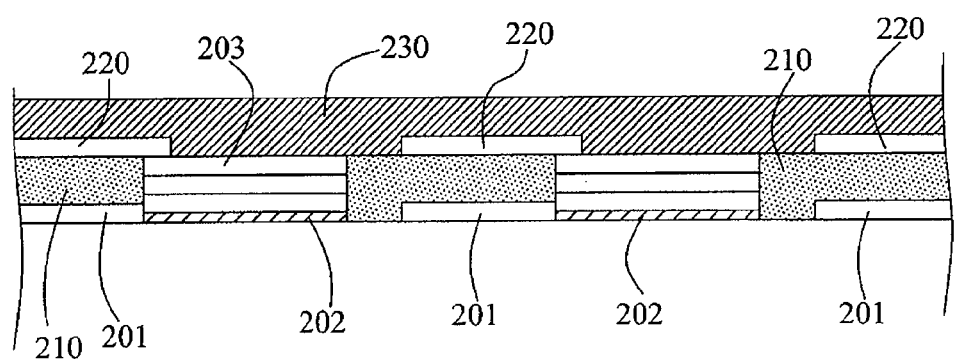
Figure 2I:
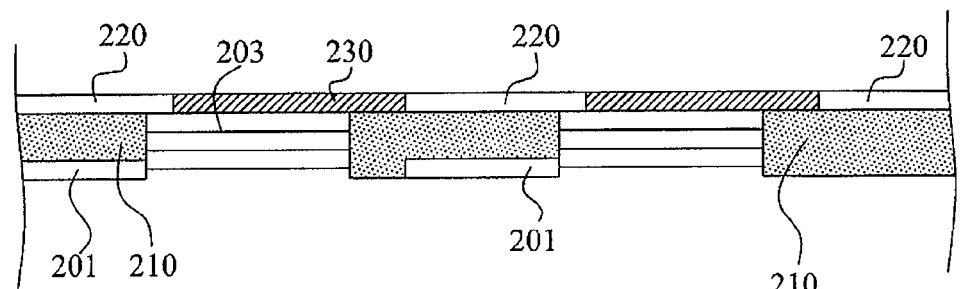

FIG. 2I shows an optional step following that of FIG. 2H. As shown, the thin film 202, which may absorb light, can be removed using an etching process. In doing so, luminescence of the light emitting diode can be enhanced. Alternatively, as shown, the insulating layer 230 can be properly polished depending on needs, for exposing the second circuit 220.

As described above, the invention provides a method integrating the printed circuit board fabrication process and the semiconductor fabrication process or another electronic component fabrication process instead of directly adhering the whole resultant electronic component, such as a packaged electronic component, to the substrate. That is, in accordance with the present invention, the printed circuit board fabrication process is firstly used to form a peripheral circuit on the substrate, and the semiconductor fabrication process or another electronic component fabrication process is then employed to directly form a principal structure of the electronic component on the substrate. Thereafter, another peripheral circuit electrically connected to the electronic component is formed using the printed circuit board fabrication process again. In the first embodiment of the invention, the electronic component refers to light emitting diode. Alternatively, the method disclosed in first embodiment can be applied in various diodes, such as a PN junction diode, a photodiode or a laser diode.

Figure 3A:
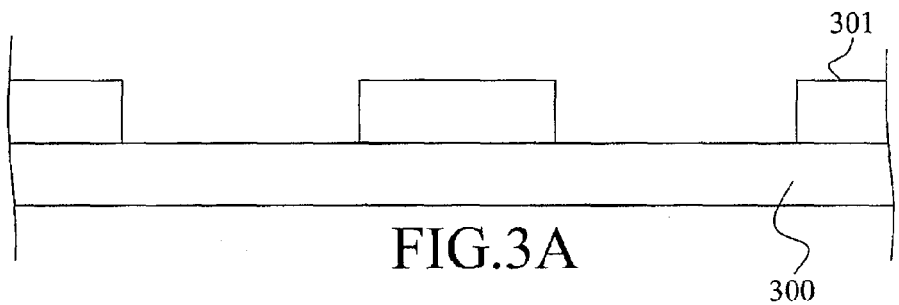
FIG. 3A to FIG. 3D are cross-sectional views illustrating a printed circuit board with embedded electronic components in accordance with a second embodiment of the present invention.
Figure 3B:
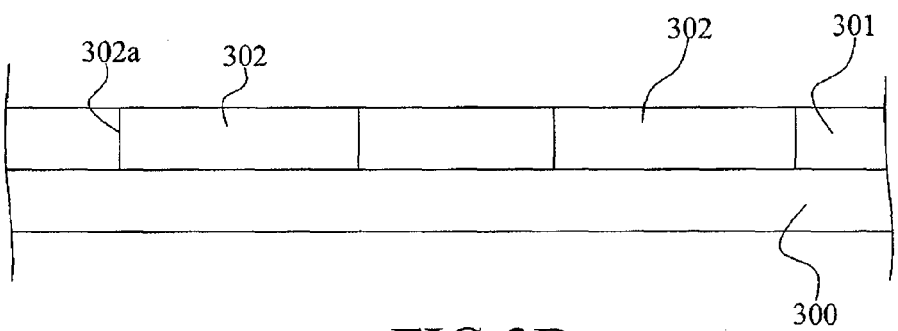

FIG. 3A to FIG. 3D illustrate a second embodiment of the present invention. The second embodiment differs from the first embodiment in that the embedded electronic component is a transistor. As shown in FIG. 3A, a substrate 300 is provided, and a first circuit 301 is formed thereon. Referring to FIG. 3B, a thin film 302 is deposited on the substrate 300. For example, the thin film 302 is directly formed on the surface of the substrate 300, and possesses an end 302a connected to the first circuit 301. The thin film 302 can be made of Si, GaAs, InP, GaP, sapphire, and SiC. The thin film 302 can be formed using conventional techniques, such as sputtering, chemical vapor deposition or screening printing.

Figure 3C:
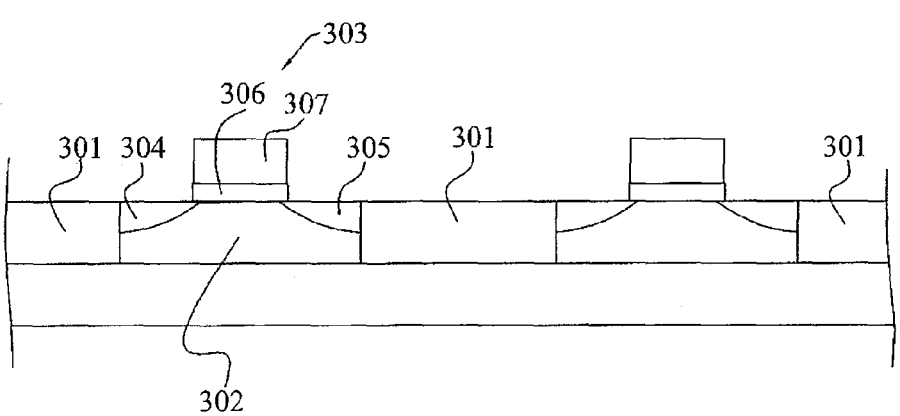
Figure 3D:
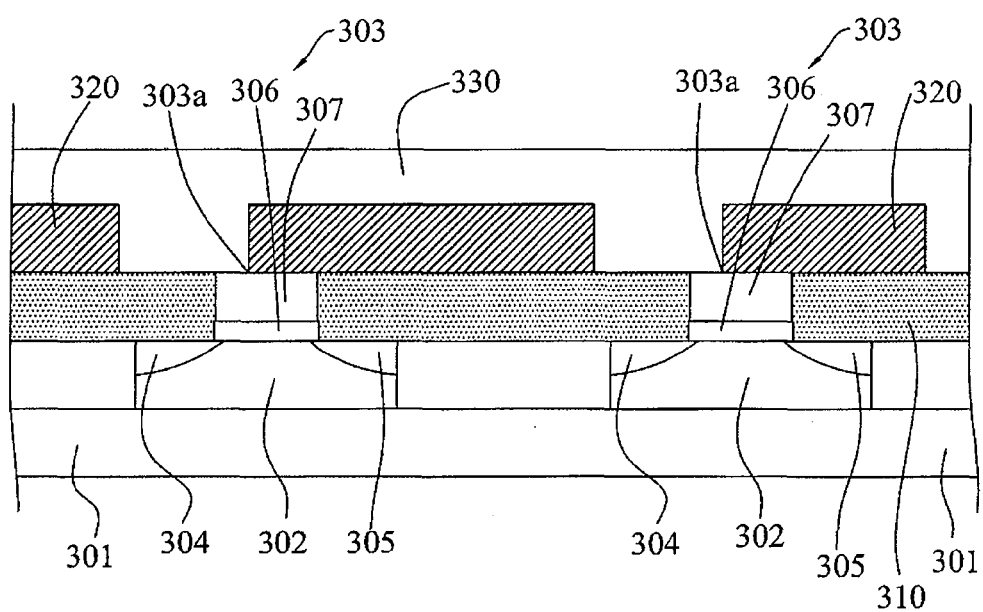

As shown in FIG. 3C, with the thin film 302 serving as a base, a transistor structure 303 is formed thereon utilizing conventional semiconductor techniques and suitable semiconductor materials. The transistor structure 303 includes a source electrode 304, a drain electrode 305, a gate insulating layer 306, and a gate electrode 307. The source electrode 304 and the drain electrode 305 are respectively connected to the first circuit 301. The subsequent steps of FIG. 3C are similar to those of the first embodiment. As shown in FIG. 3D, a dielectric layer 310 is blanketly formed, enclosing the transistor structure 303 and the first circuit 301. It is noted that the transistor structure 303 has not been packaged prior to formation of the dielectric layer 310. Thereafter, an appropriate chemical mechanical polishing technique is then employed to remove a portion of the dielectric layer 310, for exposing an upper surface 303a of the transistor structure 303. Subsequently, a second circuit 320 is formed on the dielectric layer 310, and electrically connected to the transistor structure 303 through appropriate adjustment. An insulating layer 330 is then blanketly formed, and connected to the second circuit 320, the transistor structure 303 and the dielectric layer 310. After appropriate adjustments, the insulating layer 330 is thick and strong enough to serve as a support layer for the above elements. Finally, the substrate 300 is removed.

Although only the MOS transistor is disclosed as an example of the electronic components in the second embodiment, other transistors, such as bipolar transistor or CMOS transistor can alternatively serve as the electronic component in other embodiments.

Figure 4A:
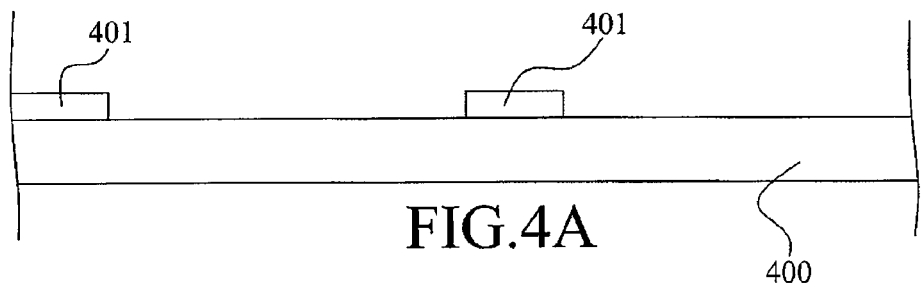
FIG. 4A to FIG. 4C are cross-sectional views illustrating a printed circuit board with embedded electronic components in accordance with a third embodiment of the present invention.
Figure 4B:
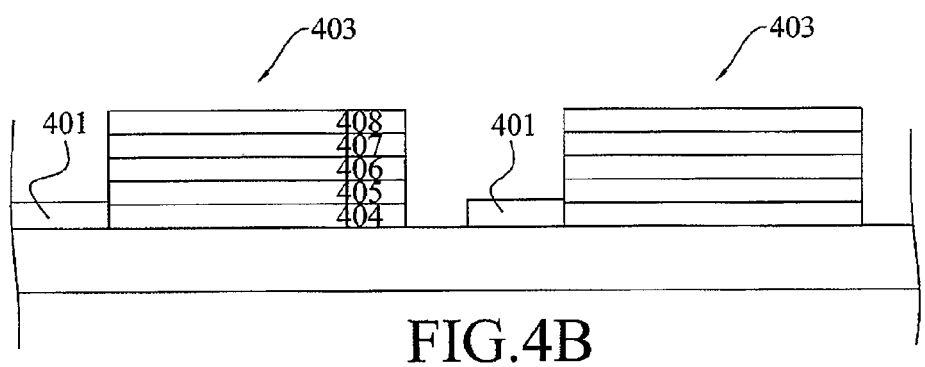
Figure 4C:
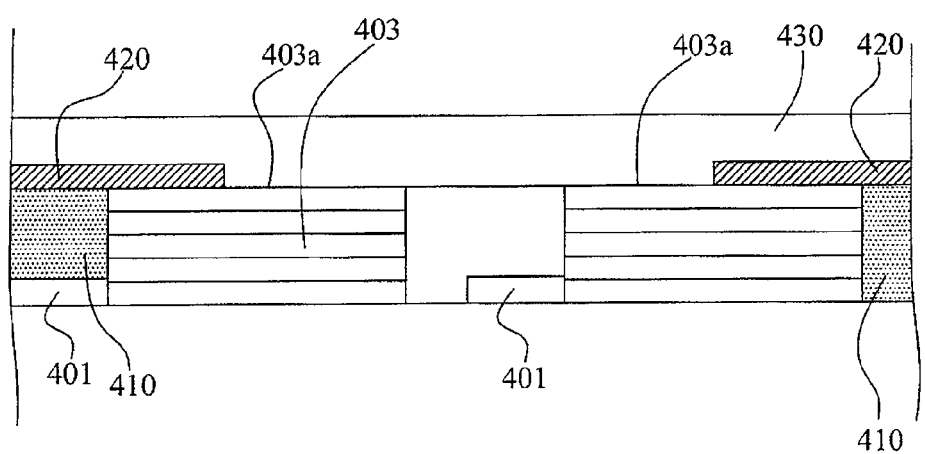

FIG. 4A to FIG. 4C illustrate a third embodiment of the present invention. The third embodiment differs from the first and second embodiments in that formation method of the electronic components excludes the step of forming the thin film 202 or 302 that serves as a base. In other words, processes that are not high temperature processes, such as vacuum evaporation, spin coating or printing including screening printing, inkjet printing or contact printing can also be employed for fabricating the embedded electronic components of the invention. In the third embodiment, an electroluminescent structure serves as the electronic component. In detail, as shown in FIG. 4A, a substrate 400 is provided, and a first circuit 401 is formed thereon. Referring to FIG. 4B, an electroluminescent structure 403 is formed through evaporation, coating or printing accompanying suitable masking techniques. The electroluminescent structure 403 includes an electron injection layer 404, an electron transport layer 405, an electroluminescent layer 406, a hole transport layer 407, and a hole injection layer 408. The electron injection layer 404 can be made of alkali metal doped organic materials. The electron transport layer 405 can be made of oxadiazole, triazoles or phenanthroline. The electroluminescent layer 406 can be made of polymers containing various fluorescent pigments. The hole transport layer 407 can be made of allylamine compounds. The hole injection layer 408 can be made of organic materials to which Lewis acid is added. The subsequent steps of FIG. 4B are similar to those of the first and second embodiments. As shown in FIG. 4C, a dielectric layer 410 is blanketly formed, enclosing the electroluminescent structure 403 and the first circuit 401. It is noted that the electroluminescent structure 403 has not been packaged prior to formation of the dielectric layer 410. Thereafter, an appropriate chemical mechanical polishing technique is then employed to remove a portion of the dielectric layer 410, exposing an upper surface 403a of the electroluminescent structure 403. Subsequently, a second circuit 420 is formed on the dielectric layer 410, and electrically connected to the electroluminescent structure 403 through appropriate adjustment. An insulating layer 430 is then blanketly formed, and connected to the second circuit 420, the electroluminescent structure 403 and the dielectric layer 410. After appropriate adjustments, the insulating layer 430 is thick and strong enough to serve as a support layer for the above elements. Finally, the substrate 400 is removed.

Although the embodiments of the invention disclose the light emitting diode, transistor and electroluminescent structure as examples of the electronic components, other electronic components suitable for the above-described methods, such as optical components, can also be used in other embodiments.

Although specific embodiments have been illustrated and described, it will be obvious to those skilled in the art that various modifications may be made without departing from what is intended to be limited solely by the appended claims.

The invention claimed is:

1. A method of forming a printed circuit board, comprising:
   providing a substrate;
   forming a first circuit on the substrate;
   depositing a thin film on the substrate wherein the thin film serves as a base for forming an electronic component;
   building the electronic component on the thin film and allowing the electronic component to electrically connect the first circuit, wherein the step of building the electronic component is performed on the substrate;
   forming a blanket dielectric layer enclosing the electronic component;
   removing a portion of the dielectric layer to expose an upper surface of the electronic component;
   forming a second circuit on the dielectric layer, the second circuit being electrically connected to the electronic component;
   forming an insulating layer covering the second circuit and the dielectric layer; thereby forming a packaged electronic component, and
   removing the substrate, wherein the step of building the electronic component excludes a step of adhering the packaged electronic component to the substrate.

2. The method of claim 1, wherein the substrate is a metal substrate, and the first circuit is formed thereon using electroplating.

3. The method of claim 1, wherein the thin film is formed of a material selected from the group consisting of Si, GaAs, InP, Gap, sapphire, and SiC.

4. The method of claim 1, wherein the step of depositing the thin film on the substrate employs sputtering, chemical vapor deposition or screen printing.

5. The method of claim 1, wherein the step of building the electronic component on the thin film comprises:
   growing an epitaxial structure on the thin film.

6. The method of claim 5, wherein the electronic component is a diode.

7. The method of claim 6, wherein, the diode is PN junction diode, photodiode or laser diode.

8. The method of claim 1, wherein the step of building the electronic component on the thin film comprises:
   forming a transistor structure on the thin film by use of a semiconductor process.

9. The method of claim 1, wherein the electronic component is unpackaged prior to the step of forming the blanket dielectric layer enclosing the electronic component.

* * * * *